United States Patent [19]

Beyer et al.

[11] Patent Number: 4,528,047
[45] Date of Patent: Jul. 9, 1985

[54] METHOD FOR FORMING A VOID FREE ISOLATION STRUCTURE UTILIZING ETCH AND REFILL TECHNIQUES

[75] Inventors: Klaus D. Beyer, Poughkeepsie; Victor J. Silvestri, Hopewell Junction, both of N.Y.

[73] Assignee: International Business Machines Corporation, Armonk, N.Y.

[21] Appl. No.: 624,425

[22] Filed: Jun. 25, 1984

[51] Int. Cl.³ .................. H01L 21/302; H01L 21/76
[52] U.S. Cl. ............................ 148/175; 29/576 E; 29/576 W; 29/578; 29/580; 148/174; 148/DIG. 26; 148/DIG. 50; 148/DIG. 85; 148/DIG. 25; 156/643; 156/644; 156/648; 156/653; 357/49; 357/50
[58] Field of Search ............. 148/174, 175; 29/576 E, 29/576 W, 578, 580; 156/643, 644, 648, 653; 357/49, 50

[56] References Cited

U.S. PATENT DOCUMENTS

| | | | |
|---|---|---|---|
| 3,661,636 | 5/1972 | Green et al. | 148/175 X |
| 3,956,033 | 5/1976 | Roberson | 29/580 X |
| 3,969,168 | 7/1976 | Kuhn | 29/576 W X |
| 4,104,086 | 8/1978 | Bondur et al. | 148/1.5 |
| 4,256,514 | 3/1981 | Pogge | 148/1.5 |
| 4,309,716 | 1/1982 | El-Kareh | 29/576 W X |
| 4,454,647 | 6/1984 | Joy et al. | 148/175 X |
| 4,473,598 | 9/1984 | Ephrath et al. | 29/576 W X |

FOREIGN PATENT DOCUMENTS

| | | | |
|---|---|---|---|
| 58-51533 | 3/1983 | Japan | 29/576 W |
| 58-192346 | 11/1983 | Japan | 29/576 W |

OTHER PUBLICATIONS

L. M. Ephrath et al., Patent Application, Ser. No. 393,997, filed Jun. 30, 1982.
J. M. Harvilchuck et al., Patent Application, Ser. No. 822,775, filed Aug. 8, 1975, now abandoned.
N. Endo et al., "Novel Device Isolation Technology with Selective Epitaxial Growth", IEDM Tech. Digest, p. 241, San Francisco Meeting, Dec. 13-15, 1982.
French, W. B., "Technique for Reducing Surface Leakage . . . ", R.C.A. Tech. Notes, No. 919, Oct. 25, 1972, 2 pages.
Druminski et al., "Selective Etching and Epitaxial Refilling . . . ", J. Crystal Growth, 31, (1975), pp. 312-316.
Runyan et al., "Behavior of Large-Scale Surface Perturbations . . . ", J. Electrochem. Soc., vol. 114, No. 11, Nov. 1967, pp. 1154-1158.

Primary Examiner—William G. Saba
Attorney, Agent, or Firm—George O. Saile

[57] ABSTRACT

A void-free isolated semiconductor substrate is described which contains a pattern of substantially vertically sided trenches within a semiconductor body. The pattern of isolation trenches isolate regions of monocrystalline semiconductor material which may contain active and passive semiconductor devices. A first insulating layer is located upon the sidewalls of the trenches. The base or bottom of the trenches is open to the monocrystalline semiconductor body. An epitaxial layer extending from the base of the trenches fills the pattern of trenches up to a level from the upper surface of the trenches as specified approximately by the equation:

$$y = 0.34x$$

where y is the distance between the epitaxial layer and the top surface and x is the trench width. The preferred range for the trench width x is about 10 micrometers or less. A polycrystalline silicon layer fills the additional portion of the pattern of trenches above the upper surfaces of the epitaxial layer. A second insulating layer is located on the polycrystalline silicon layer within the trenches for isolation of the pattern of trenches from the ambient. It is the dense epitaxial monocrystalline semiconductor which prevents the formation of voids within the pattern of trenches. The polycrystalline silicon layer above the epitaxial layer completely covers the undesirable sharp faceted structure at the top of the epitaxial semiconductor growth structure.

12 Claims, 8 Drawing Figures

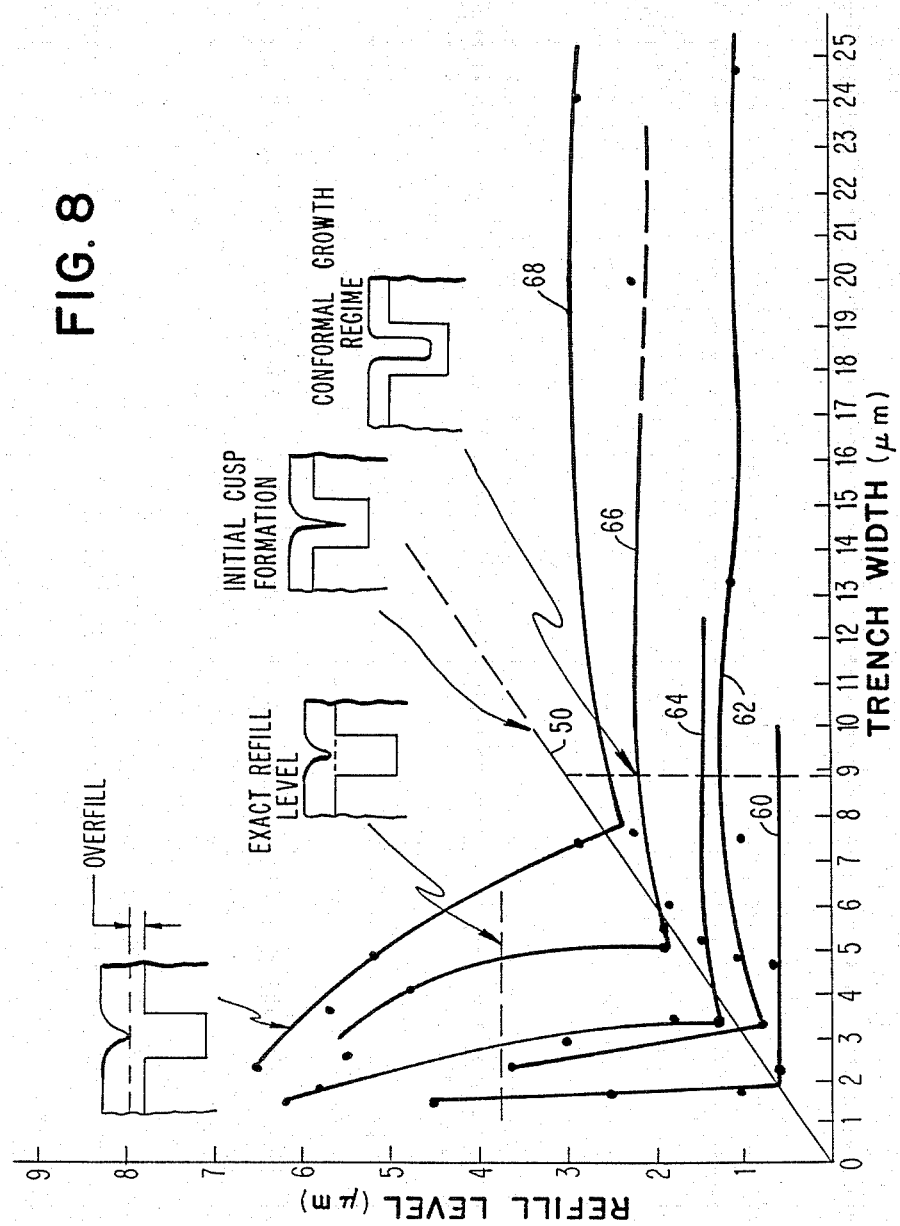

METHOD FOR FORMING A VOID FREE ISOLATION STRUCTURE UTILIZING ETCH AND REFILL TECHNIQUES

FIELD OF INVENTION

The present invention is concerned with methods for filling trenches in semiconductor substrates so as to form void free patterns of isolation within the substrate. In particular, the process and resulting structure is involved in forming a pattern of isolation in a semiconductor substrate wherein the isolation includes epitaxial semiconductor material and polycrystalline silicon material.

CROSS REFERENCE TO RELATED APPLICATION

Patent application Ser. No. 624,320, filed 6/25/84, entitled "Method for Forming a Void Free Isolation Pattern and Resulting Structure", by V. J. Silvestri et al.

DESCRIPTION OF THE PRIOR ART

In the monolithic integrated circuit technology, it is usually necessary to isolate various active and passive elements from one another within the integrated circuit structure. These devices have been isolated by back biasing PN junctions, partial dielectric isolation and complete dielectric isolation. The dielectric materials used have been silicon dioxide and the like. The preferred isolation for these active and passive devices is some form of dielectric isolation. The dielectric isolation has the substantial advantage over PN junction isolation because it allows the butting of circuit elements against the isolation and thereby result in greater density of packing of the active and passive devices in the integrated circuitry.

A form of dielectric isolation is disclosed in the H. B. Pogge U.S. Pat. No. 4,256,514. Pogge describes isolation refill techniques employed in deep trench isolation formation wherein chemical vapor deposition or the like is used to deposit insulating material such as, silicon dioxide or polycrystalline silicon into the pattern of trenches. Such systems involve a homogeneous gas phase reaction wherein the silicon dioxide, polycrystalline silicon or the like is formed in the gas from the reactive species present and is deposited therefrom onto the surfaces and into the pattern of trenches. The problem with this method of deposition is that there is a tendency to form voids within the trench patterns particularly where trenches cross one another. Also, the refilling deposition can produce structurally deficient or loosely packed material which may not be the best isolation structures in integrated circuits. The presence of voids and this loose structure have a tendency to magnify the formation of defects in silicon areas which are later to serve as active or passive device regions.

The L. M. Ephrath et al., patent application Ser. No. 393,997 filed June 30, 1982, now U.S. Pat. No. 4,473,598, assigned to the same assignee as the present invention describes another dielectric isolation method and resulting structure wherein the pattern of trenches is filled with void-free polycrystalline silicon or epitaxial silicon. Ephrath et al., utilize a sidewall composed of insulating material with or without a nucleating material thereover. The bottom of the trench pattern is open to the monocrystalline semiconductor body such as silicon. Epitaxial silicon is then grown from the bottom opening to the monocrystalline silicon body and perpendicular from the sidewall surfaces containing the nucleating material. While the result of this epitaxial growth is a void free-structure, there are sharp grooves near the top of the insulating sidewall, as seen in the FIG. 1 drawing, where the insulating sidewall is silicon dioxide layer 1 and silicon nitride layer 2 and no nucleating material is used. The epitaxial layer filling 3 grows from the substrate 4. The epitaxial layer and substrate is typically monocrystalline silicon. This is also illustrated in N. Endo et al., "Novel Device Isolation Technology with Selective Epitaxial Growth" IEDM Tech. Digest p. 241, San Francisco Meeting Dec. 13-15, 1982. Where a nucleating layer 5 of, for example, polycrystalline silicon is used over the insulating sidewall 1, 2 only a small epitaxial layer filling 6 and mostly polycrystalline semiconductor layer 7 results as seen in FIG. 2. A void 8 is usually formed in the structure particularly where the trench is deep such as 3 to 6 micrometers or more.

SUMMARY OF THE PRESENT INVENTION

The void-free isolated semiconductor substrate is described which contains a pattern of substantially vertically sided trenches within a semiconductor body. The pattern of isolation trenches isolate regions of monocrystalline semiconductor material which may contain active and passive semiconductor devices. A first insulating layer is located upon the sidewalls of the trenches. The base or bottom of the trenches is open to the monocrystalline semiconductor body. An epitaxial layer extending from the base of the trenches fills the pattern of trenches up to a level from the upper surface of the trenches as specified approximately by the equation:

$$y = 0.34x$$

where y is the distance between the epitaxial layer and the top surface and x is the trench width.

The preferred range for the trench width x is about 10 micrometers or less. A polycrystalline silicon layer fills the additional portion of the pattern of trenches above the upper surfaces of the epitaxial layer. A second insulating layer is located on the polycrystalline silicon layer within the trenches for isolation of the pattern of trenches from the ambient. A polycrystalline silicon nucleating layer may also be located upon the sidewalls above epitaxial silicon filling and on the epitaxial silicon upper portion to assure the growth of a dense, evenly grown polysilicon layer in the pattern of trenches. It is the dense epitaxial monocrystalline semiconductor which prevents the formation of voids within the pattern of trenches. The polycrystalline silicon layer above the epitaxial layer completely covers the undesirable sharp faceted structure at the top of the epitaxial semiconductor growth structure.

The methods for forming void-free isolation patterned structure in a semiconductor body such as, monocrystalline silicon proceeds by first forming substantially vertically sided pattern of trenches having an insulating layer sidewall and open bottom to the monocrystalline silicon body. Monocrystalline silicon is epitaxially grown in the trenches from the monocrystalline silicon bottom to form a dense void-free trench structure up to a level specified approximately by the equation:

$$y = 0.34x$$

where y is the distance between the epitaxial layer and the top surface and x is the trench width. The upper surfaces of the epitaxial grown layer forms an objectionable sharp grooved or faceted structure with the insulating layer sidewall. Polycrystalline silicon is formed over the surfaces of the trench to completely cover this objectionable sharp faceted structure. The polycrystalline silicon layer is removed from areas above the pattern of trenches by a known planarization techniques. A passivation layer such as, silicon dioxide may be utilized to isolate the pattern of trenches from the ambient. This may be accomplished by the thermal oxidation of the polycrystalline silicon at a suitable temperature to form a silicon dioxide layer on the polycrystalline silicon layer in the pattern of trenches.

BRIEF DESCRIPTION OF THE DRAWINGS

FIG. 8 is a graphical representation showing the relationship of void-free filling versus trench width.

DETAILED DESCRIPTION OF THE PREFERRED EMBODIMENTS

Figure 1:
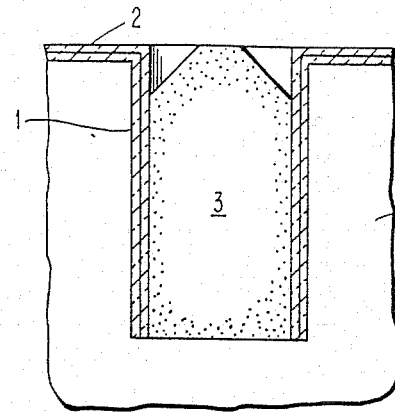
FIG. 1 illustrates a prior art filled trench structure which has been formed using the epitaxial growth of semiconductor material.
Figure 2:
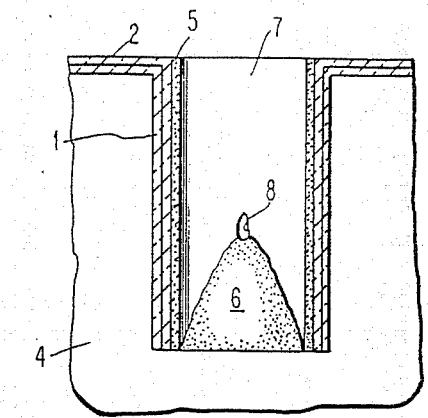
FIG. 2 is a prior art illustration of a trench which has been filled using the polycrystalline silicon.
Figure 3:
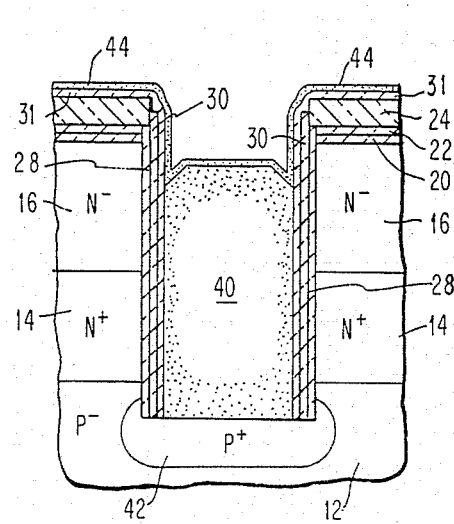
FIGS. 3 through 6 illustrate the process of the present invention for forming a void-free isolation structure in a monocrystalline semiconductor body.

Referring now more particularly to FIG. 3, there is shown a semiconductor body 12 of a P-conductivity type. The semiconductor body is typically <100> crystallographically oriented silicon and of a resistivity in the order of 1 to 20 ohm-cm. Conventional lithography and etching techniques are utilized to form the mask for the subcollector diffusion step. N type impurities are then diffused by conventional techniques to form a region having a surface concentration level of typically $5 \times 10^{20}$ atoms/cc. The N type impurity may be, for example, arsenic or antimony. The structure is now subjected to a thermal oxidation to form silicon dioxide thereover. Simultaneously with the growth of the silicon dioxide, the N type impurity is driven further into the semiconductor body. If it were desired to form a PNP transistor rather than an NPN transistor, opposite conductivity types are utilized as is well understood by those skilled in the art.

The silicon dioxide layer on the surface of the silicon body is removed by use of conventional etching techniques. The silicon body is then placed in an epitaxial growth chamber and a monocrystalline silicon layer is grown upon the principal surface of the silicon body having the N+ diffusions therein. This growth is done by conventional techniques such as the use of $SiCl_4/H_2$, $SiH_2Cl_2/H_2$ or $SiH_4/H_2$ mixtures at growth temperatures of about 1000° C. to 1200° C. The thickness of the epitaxial layer is typically 1.5 micrometers but may be in the range of 0.5 to 5 micrometers. During the epitaxial growth the epitaxial layer is doped with an N− type impurity of a low concentration level which is typically $2 \times 10^{16}$ atoms/cc. During the epitaxial growth, the N+ region outdiffuses into the epitaxial layer to fully form the final N+ region 14 as illustrated in FIG. 3. The remaining portions of the epitaxial layer 16 will be N− doped. The region 14 will be connected as the subcollector of the NPN transistor as is understood by those skilled in the art.

Silicon dioxide layer 20 is formed by conventional techniques of either thermal growth at a temperature of about 970° C. in wet or dry oxygen ambient or by chemical vapor deposition. The silicon nitride layer 22 is formed thereover typically by a chemical vapor deposition. A second silicon dioxide layer 24 is formed by chemical vapor deposition over the silicon nitride layer 22. A resist layer (not shown) is deposited over layer 24.

This layer is then formed into a mask using conventional lithography techniques so that openings are provided in the desired pattern of isolation trenches planned. The layers 20, 22 and 24 are etched using conventional chemical, reactive ion etching or plasma etching techniques at the openings of resist layer down to the monocrystalline silicon substrate.

The substrate is now ready to utilize the layers 20, 22, 24 as the mask for the trench formation following the removal of the resist layer from the surface of layer 24. This process must be accomplished using anisotropic reactive ion etching (RIE) which produces substantially vertical sidewalls for the trenches. The trench depth for bipolar device isolation is at least 3 and preferably 4 to 7. One suitable example of forming the trenches by RIE is the use of carbontetrafluoride ($CF_4$) gas. Other suitable examples of gases include $CCl_4$-Ar and and $Cl_2$-Ar. Details of the RIE are described in the co-pending patent application of J. M. Harvilchuck et al., Ser. No. 960,322, filed Nov. 13, 1978, which is a continuation of patent application Ser. No. 822,775, filed Aug. 8, 1975, now abandoned and the J. A. Bondur et al., U.S. Pat. No. 4,104,086 and assigned to the same assignee as the assignee of this invention.

An insulator layer 28 of, for example, silicon dioxide is preferably formed by thermal oxidation in steam at a temperature of about 970° C. on the surface of the trenches. The layer 28 of silicon dioxide may alternatively be formed by chemical vapor deposition but this would necessitate the removal of the deposited silicon dioxide from the layer 24 surface. The preferred thickness of the layer 28 of the silicon dioxide is preferably in the range of 30 to 100 nanometers. It is also desirable to form a silicon nitride layer 30 on the surface of this silicon dioxide layer 28 to improve the isolation properties of the sidewall. This silicon nitride layer can be deposited by conventional chemical vapor deposition techniques. This nitride should be between about 30 to 100 nanometers to prevent defect formation. An additional layer 31 of silicon dioxide is preferably deposited on the silicon nitride layer for the subsequent partial epitaxial refill step. This silicon dioxide layer 31 can be as thin as 50 to 500 nanometers. It can be deposited by LPCVD techniques using a reactant such as TEOS.

The layers 28, 30 and 31 are removed from the base of the trench pattern by reactive ion etching. The result of the process is shown in FIG. 3.

Next, monocrystalline semiconductor material, typically silicon is epitaxially grown in the pattern of trenches from the monocrystalline semiconductor bottom of the trench. The method of growing silicon is by a gas-solid or heterogeneous reaction system. The heterogeneous reaction system desirably includes hydrogen, silicon and chlorine. The particularly preferred system is a combination of gases including $SiCl_4$, $H_2$ and P+ dopant $B_2H_6$ with an HCl injection as described in the cross-referenced patent application above. The epitaxial growth trench filling process is carried out at temperature of between about 900° C. to 1100° C. and preferably about 1000° C. to provide a sufficiently fast filling of the trenches. The preferred rate is between 0.07-0.2 μm/minute. This is highly preferrable when a bipolar pattern of trench isolation is being formed, because of the substantial depth of the trenches. The dopant concentration of $B_2H_6$ or the like is between about $5 \times 10^{17}$ to $5 \times 10^{20}$ to provide a epitaxial filling material having a resistivity of about 0.1 to 0.0006 ohm-cm. Subsequent heating of this structure produces a P+ region 42 in the substrate to form one portion of the isolation structure. The trench widths on the same integrated circuit substrate may be of various widths in the range of, for example, 1 to 300 micrometers. Experiments have shown that the re-filling level of epitaxial silicon does not vary significantly for trench widths in this range with a experimental maximum deviation to be about ±10%. Re-fills using this system contain no voids and exhibited top growth surfaces indicative of highly-oriented single crystal growth.

Figure 7:
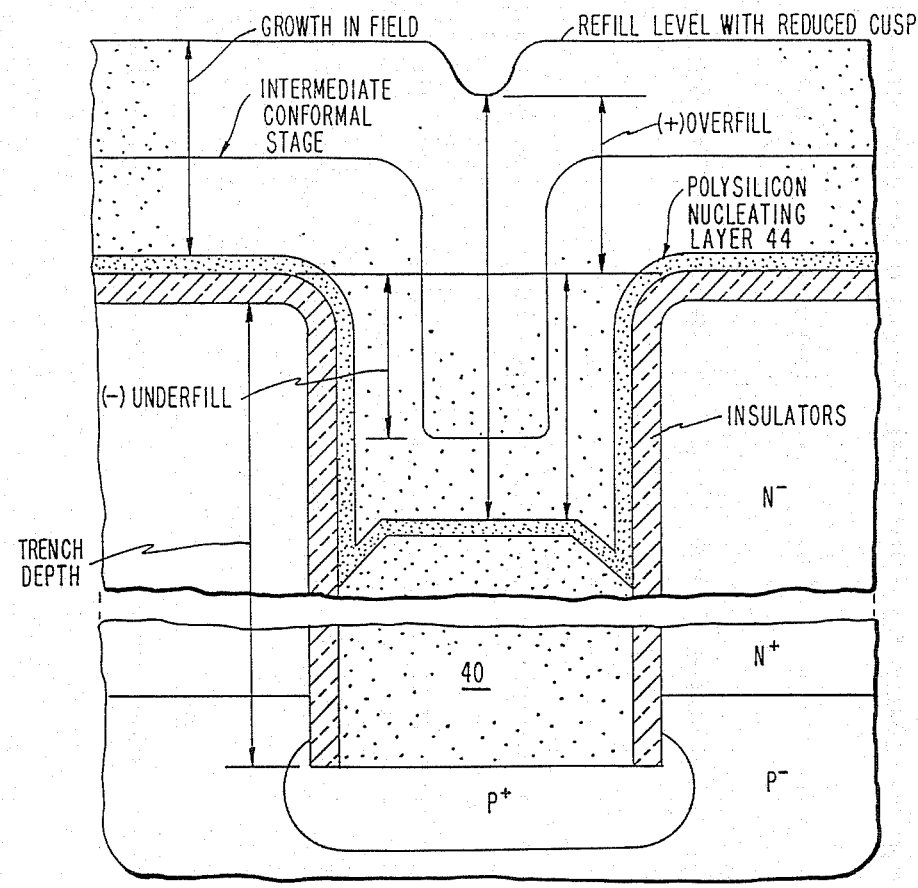
FIG. 7 illustrates the problem and solution of filling the top portion of the pattern of trenches with polycrystalline silicon while not causing void formation.

The epitaxial layer extends from the base of the pattern of trenches up to between about 0.3 to 4 micrometers or more from the upper top surface of the pattern of trenches. The 0.34 case is where the trench width is about 1 micrometer and 3.4 is where the trench width is 10 micrometers. The equation $y=0.34x$ applies where y is the distance between the epitaxial layer and the top surface and x is the trench width. The preferred range of trench width is less than about 10 micrometers. The criteria for the height of this epitaxial fill in the trench is based upon the cross-section of the trench so that no void occurs during the subsequent deposition of the polycrystalline silicon filling material. The consideration and details of this problem will be considered subsequently when FIGS. 7 and 8 are considered in detail. The depth of the trench is not an important consideration in deciding what portion of the trench should be left for the final polysilicon refill. This is due to the nature of the growth stages to be described in relation to FIG. 8 below. A nucleating layer 44 is deposited over the exposed epitaxial surface as seen in FIG. 3 so that the upper surface of the epitaxial layer 40, the presently exposed sidewall of the pattern of trenches and the upper surface of layer 24 are covered with this nucleating layer 44. The nucleating layer is preferably used and is composed of polycrystalline silicon to produce a uniform growth from the surface at a given growth rate. It is very important that this uniform growth is obtained so that the subsequent chemically-mechanically polishing process is effective in removing the subsequent polycrystalline silicon layer from the surface 24. The preferred process for laying down this nucleating layer involves deposition of polysilicon in a LPCVD system employing $SiH_4$ at 650° C. to a thickness of between 100 to 300 nanometers. The preferred amount being 200 nanometers.

Figure 4:
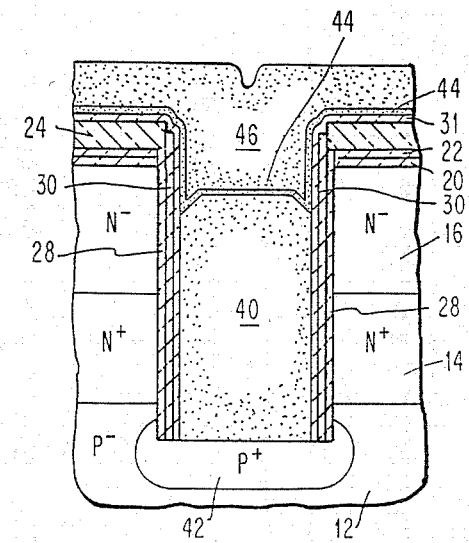

The next step is to deposit a polycrystalline silicon layer 46 as seen in FIG. 4 to completely fill the pattern of trenches without forming any voids within the structure. A polysilicon layer 46 is now chemically-mechanically polished using a 3 weight percent $SiO_2$ slurry in $H_2O$ adjusted to pH=11.8. The polishing is carried out at 16 psi for desired time. A poromeric polishing pad is used to rotatably press against the wafers being polished at the 16 pSi causing the removal of elevated portions of the polysilicon layer. The mechanism of the process is not fully understood, but it is believed that the surface of the polysilicon is hydrolyzed by the slurry and it is this softer material which is polished of by action of the $SiO_2$ slurry and the polishing pad.

Figure 5:
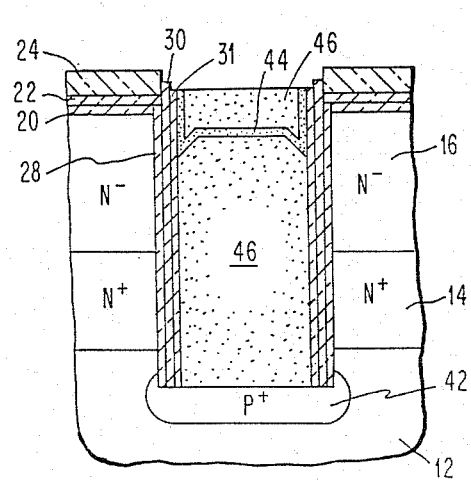
Figure 6:
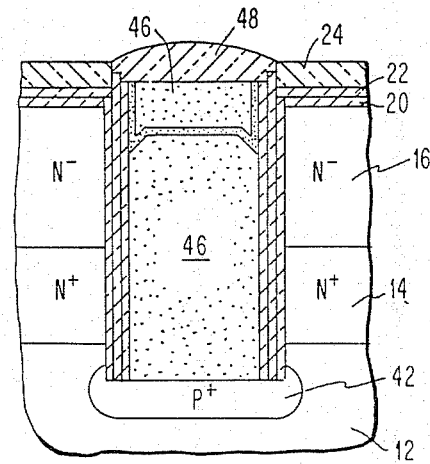

Plasma etching or the like may be now utilized to remove a portion of the polycrystalline silicon from the pattern of the trenches so as to produce the structure shown in FIG. 5. A silicon dioxide capping layer may now be formed by thermal oxidation of the polycrystalline silicon layer 46. The resulting capping layer is shown at FIG. 6 as layer 48.

FIG. 7 schematically illustrates the problem of forming a conformal layer of polycrystalline silicon over the epitaxial silicon partially filled trench. FIG. 8 is a plot of refill level vs. trench width observed for five polysilicon refill experiments which employed different times. The detailed experiments are given in the Examples I through V below. Trenches of different widths were formed on a silicon substrate such that they would be filled to differing levels. Scanning electron microscope photos were taken of cleaved cross-sections of the trench and refill. Measurements were taken from the photos to obtain the data shown in FIG. 8 and Tables I-V. In FIG. 8 schematic drawings of the important growth stages of refill observed are depicted in the insert accompanying the data described further below in more detail.

To accomplish elimination of voids in the polysilicon refill it is important to remain in the conformal growth regime as defined in FIG. 8. This regime includes conditions that include that portion of the plot below the line 50 drawn through the data and zero. This line 50 can be expressed by the linear equation $y=0.34x$ where y is the "refill level" at which the first void could possibly form and x is the "trench width". Voids can form when the sidewall growth meets at the bottom of the trench to form an initial cusp or steep V-shaped refill. Refill rates are observed to increase sharply at this point of initial meeting of sidewall surfaces. Rates can be obtained from FIG. 8 by dividing the refill level achieved for each data set by the time associated with the experiment indicated in the key. The key being: curve 60=3.3 minutes; curve 62=5 minutes; curve 64=6.6 minutes; curve 66=10 minutes; and curve 68=15 minutes. It is in this final closure stage that voids can form. The voids result when slightly unmatched surfaces meet, join and prevent deposition gases further access. Voids observed are of the order of polysilicon crystallite (about 200 nanometers or less) which make up the wall irregularities, and are observed to occur randomly along a seam aligned with a cusp. This cusp runs centrally in trenches. These depressions can be more pronounced at trench intersections and corners where the diagonal distance is greater for a trench of given width.

Just filled levels in trenches of a given width as shown in FIG. 8 result in trench corners and intersections being underfilled. Therefore, fill levels required must be based on the widest trench dimension found in the trench configuration at the corners or intersections. It has also been found that some over filling of trenches is desirable to reduce local non-planarities (cusp reduction).

A characteristic of the growth kinematics in the conformal regime is that the linear rate of polysilicon as measured normal from the polysilicon nucleating layer 44 is approximately constant and the polysilicon refill is conformal and equal in thickness as measured from the vertical and horizontal trench surfaces. It is therefore important to achieve the desired refill level while in the conformal regime. Voids do not form while in this conformal regime.

The data in FIG. 8 is employed to determine trench depths in which conformal growth ensues for trenches of approximately 1-10 micrometers in width. It should be understood, however, that trenches of larger width such as up to 300 micrometers or greater, could be included with the smaller width trenches on the same wafer since conformal growth would also be occurring in these. The sidewall closure of such large width trenches would not occur prior to the smaller trenches being adequately filled, and voids would not form.

FIG. 7 indicates the problem and solution namely first refilling partially with void free epitaxial silicon as described above and determining from FIG. 8. the remaining portion to be filled with polysilicon such that the initial cusp formation, along with the concomitant ensueing rapid refill rates which incorporate voids are avoided.

FIG. 7 in addition schematically defines measurements and quantities discussed in the Examples shown below in FIG. 8 and attached Tables which illustrate the utility of the data.

The following examples are included merely to aid in the understanding of the invention and variations may be made by one skilled in the art without departing from the spirit and scope of the invention.

EXAMPLE I

A mask set to form a series of trenches of the width indicated in the Table I was utilized to expose a photoresist layer which covered a silicon dioxide layer on a silicon substrate. Standard lithography and etching techniques were utilized to form this desired pattern in the silicon dioxide layer. A reactive ion etching process was utilized which included the use of $CF_4$-$H_2$ to form a depth of trench as indicated in Table I for each of these trench widths. Polycrystalline silicon was deposited using an epitaxial AMC 7000 reactor manufactured by Applied Materials, Santa Clara, Calif., at atmospheric pressure. The reactor was purged of air using first nitrogen gas and then hydrogen gas with the loaded wafers in the reactor. The reactor was heated to a temperature of 1000° C. The reactant gas $SiCl_4$ and dopant $B_2H_6$ were passed into the reactor with the $SiCl_4$ flow being 5 lpm (liters per minute) of $H_2$ through $SiCl_4$ at 20 psig. (Bubbler at room temperature) and the $B_2H_6$ flow rate was 8.5 lpm of 60 ppm. The polysilicon deposition rate was about 0.22 micrometers/minute. A resistivity of 0.003 ohm-cm. was obtained. The refilling process was continued 5 minutes. After the deposition, the reactor was purged with hydrogen and then nitrogen. The samples were cleaved through the trench sets having different width to obtain a cross-sectional view of the refills using scanning electron microscopic (SEM) techniques. Measurements were made from the photos to establish refill rates in the trenches of various width and determine the refill character. These measurements are given in the Table I.

EXAMPLE II

The identical process was utilized as described under Example I but the process was continued for 10 minutes. Also, the trench width and trench depth are varied slightly from the Example I trench width and trench depth and are given in Table II. The results of this process were measured as described in Example I and the results of these measurements.

EXAMPLE III

The process of Example I was again repeated utilizing the trench width and trench depth indicated in Table III and the process was continued for 15 minutes. The measurements of the resulting filled structures were made according to the description of Example I and have been listed in Table III.

EXAMPLE IV

The process of Example III was again repeated utilizing the trench width and trench depth indicated in Table IV and the process was continued for 3.3 minutes. The measurements of the resulting filled structures were made according to the description of Example III and have been listed in Table IV.

EXAMPLE V

The process of Example IV was again repeated utilizing the trench width and trench depth indicated in Table V and the process was continued for 6.6 minutes. The measurements of the resulting filled structures were made according to the description of Example IV and have been listed in Table V.

TABLE I

| | | TRENCH REFILL KINEMATICS (5 MIN. RUN) | | | | |
|---|---|---|---|---|---|---|
| TRENCH WIDTH ($\mu$m) | TRENCH DEPTH ($\mu$m) | UNDERFILL (−) OR OVERFILL (+) ($\mu$m) | GROWTH IN FIELD ($\mu$m) | CUSP DEPTH ($\mu$m) | CUSP WIDTH ($\mu$m) | TOTAL REFILL LEVEL ($\mu$m) |
| 2.2 | 3.59 | (+)0.242 | 0.96 | 0.87 | 2.2 | 3.63 |
| 3.3 | 3.59 | (−)2.57 | 1.0 | 3.78 | 3.4 | 0.82 |
| 4.85 | 3.88 | (−)2.62 | 1.16 | 3.98 | 5.0 | 1.06 |
| 7.45 | 3.86 | (−)2.62 | 0.98 | 3.86 | 7.73 | 1.04 |
| 13.2 | 3.80 | (−)2.48 | 1.12 | 3.80 | 12.5 | 1.12 |
| 24.7 | 3.80 | (−)2.47 | 1.17 | 3.57 | 25.8 | 1.13 |

TABLE II

| | | TRENCH REFILL KINEMATICS (10 MIN. RUN) | | | | |
|---|---|---|---|---|---|---|
| TRENCH WIDTH ($\mu$m) | TRENCH DEPTH ($\mu$m) | UNDERFILL (−) OR OVERFILL (+) ($\mu$m) | GROWTH IN FIELD ($\mu$m) | CUSP DEPTH ($\mu$m) | CUSP WIDTH ($\mu$m) | TOTAL REFILL LEVEL ($\mu$m) |
| 2.44 | 3.66 | (+)2.0 | 2.3 | 0.49 | 2.0 | 5.46 |
| 4.0 | 3.6 | (+)1.38 | 2.2 | 0.9 | 3.4 | 4.78 |
| 4.9 | 3.7 | (−)1.59 | 2.13 | 2.7 | 2.8 | 1.90 |
| 5.4 | 3.5 | (−)1.43 | 1.8 | 3.5 | 4.2 | 1.87 |
| 7.46 | 3.98 | (−)1.49 | 2.28 | 4.2 | 7.4 | 2.29 |

TABLE II-continued

TRENCH REFILL KINEMATICS (10 MIN. RUN)

| TRENCH WIDTH (μm) | TRENCH DEPTH (μm) | UNDERFILL (−) OR OVERFILL (+) (μm) | GROWTH IN FIELD (μm) | CUSP DEPTH (μm) | CUSP WIDTH (μm) | TOTAL REFILL LEVEL (μm) |
|---|---|---|---|---|---|---|
| 20.0 | 3.97 | (−)1.49 | 2.12 | 5.6 | 20.8 | 2.28 |

TABLE III

TRENCH REFILL KINEMATICS (15 MIN. RUN)

| TRENCH WIDTH (μm) | TRENCH DEPTH (μm) | UNDERFILL (−) OR OVERFILL (+) (μm) | GROWTH IN FIELD (μm) | CUSP DEPTH (μm) | CUSP WIDTH (μm) | TOTAL REFILL LEVEL (μm) |
|---|---|---|---|---|---|---|
| 2.13 | 3.59 | (+)3.0 | 3.2 | 0.6 |  | 6.39 |
| 3.49 | 3.59 | (+)2.26 | 3.2 | 0.9 | 2.2 | 5.65 |
| 4.70 | 3.59 | (+)1.8 | 3.2 | 1.74 | 3.48 | 5.19 |
| 7.25 | 3.6 | (−)0.52 | 3.26 |  | 6.64 | 2.88 |
| 12.7 | 3.52 |  | 3.5 |  |  |  |
| 24.0 | 3.13 |  | 3.52 |  |  | 2.9 |

TABLE IV

| TRENCH WIDTH (μm) | TOTAL REFILL (μm) |
|---|---|
| 1.36 | 4.5 |
| 1.56 | 2.5 |
| 1.7 | 1.3 |
| 2.2 | .7 |
| 4.6 | .8 |

TABLE V

| TRENCH WIDTH (μm) | TOTAL REFILL (μm) |
|---|---|
| 1.35 | 6.2 |
| 1.7 | 5.8 |
| 2.2 | 5.25 |
| 2.8 | 3.0 |
| 3.26 | 1.8 |
| 3.28 | 1.3 |
| 5.02 | 1.4 |

The data obtained in the Tables I-V was plotted in FIG. 8. The elimination of the voids in the polysilicon refill is accomplished by remaining in the conformal growth regime as seen in FIG. 8. The conditions for conformal growth is below the line 50 which may be expressed by the equation $y = 0.34x$.

While the invention has been particularly shown and described with reference to the preferred embodiments thereof, it will be understood by those skilled in the art that the foregoing and other changes in form and detail may be made therein without departing from the spirit and scope of the invention. For example, MOSFET devices may be formed within the isolation trench pattern rather than bipolar devices as described in the principal examples herein. Where MOSFET, devices are used, the epitaxial layer may or may not be present as is understood by those skilled in the art. Where the epitaxial layer is not used, the depth of the isolation pattern may be reduced.

What is claimed is:

1. Method for forming a void free isolation structure in a monocrystalline silicon body comprising:

providing a substantially vertically sided pattern of trenches having an insulating layer sidewall and monocrystalline silicon bottom;

epitaxially growing monocrystalline silicon in said trenches from said monocrystalline silicon bottom;

ending said monocrystalline growth between about 0.3 to 4.0 micrometers from the top of said trenches; and depositing polycrystalline silicon over the surface containing said trench and in said trenches until the said trenches are filled.

2. The method of claim 1 wherein said insulating layer sidewall is silicon nitride.

3. The method of claim 2 wherein a silicon dioxide layer is formed between said silicon nitride sidewall and said monocrystalline silicon body.

4. The method of claim 1 wherein a layer of nucleating material is formed on the surfaces of the said insulating layer sidewall in the region and the upper surfaces of the said epitaxial silicon where said polycrystalline silicon is to be formed.

5. The method of claim 4 wherein said nucleating layer is polycrystalline silicon.

6. The method of claim 1 wherein the depth of said trenches is between about 3 to 10 micrometers.

7. The method of claim 6 wherein the width of said trenches is between about 1 to 10 micrometers.

8. The method of claim 1 wherein said epitaxially growing silicon is accomplished by chemical vapor deposition from an atmosphere of SiCl$_4$, H$_2$ and HCl.

9. The method of claim 8 wherein said polycrystalline silicon is deposited by chemical vapor deposition from an atmosphere of SiCl$_4$ and H$_2$.

10. The method of claim 9 wherein the said polycrystalline silicon is deposited using the same deposition system used for said epitaxially growing silicon.

11. The method of claim 1 wherein said polycrystalline silicon layer is removed in areas above said trenches.

12. The method of claim 11 wherein the upper surfaces of said polycrystalline layer in said trenches are thermally oxidized to form a silicon dioxide cap thereon.

* * * * *